United States Patent
Ting

[11] Patent Number: 5,838,032
[45] Date of Patent: Nov. 17, 1998

[54] PRECISION CAPACITOR ARRAY

[75] Inventor: Jyh-Kang Ting, Hsin-Chu, Taiwan

[73] Assignee: Taiwan Semiconductor Manufacturing Company Ltd., Hsin-Chu, Taiwan

[21] Appl. No.: 801,677

[22] Filed: Feb. 18, 1997

Related U.S. Application Data

[62] Division of Ser. No. 490,856, Jun. 15, 1995, Pat. No. 5,635,421.

[51] Int. Cl.⁶ .................................................. H01L 27/10
[52] U.S. Cl. .......................... 257/211; 257/306; 257/307; 257/754; 257/756; 257/774; 257/920
[58] Field of Search ...................... 257/211, 306, 257/307, 754, 756, 774, 920

[56] References Cited

U.S. PATENT DOCUMENTS

| | | | |
|---|---|---|---|
| 4,149,302 | 4/1979 | Cook | 257/758 |
| 4,729,063 | 3/1988 | Matsuo et al. | 257/774 |
| 5,066,997 | 11/1991 | Sakurai et al. | 257/211 |
| 5,322,438 | 6/1994 | McNutt et al. | 437/51 |
| 5,391,914 | 2/1995 | Sullivan et al. | 257/758 |
| 5,396,092 | 3/1995 | Peek | 257/758 |
| 5,404,045 | 4/1995 | Mizushima | 257/786 |

FOREIGN PATENT DOCUMENTS

| | | | |
|---|---|---|---|
| 357192062 | 11/1982 | Japan | 257/211 |
| 360245271 | 12/1985 | Japan | 257/211 |
| 405343546 | 12/1993 | Japan | 257/211 |

*Primary Examiner*—Valencia Martin-Wallace
*Attorney, Agent, or Firm*—George O. Saile; Stephen B. Ackerman

[57] ABSTRACT

Capacitor arrays may be incorporated within silicon integrated circuits as part of analog-to-digital or digital-to-analog converters. Capacitance ratios between individual capacitors need to be controlled to better than 1%. Because of microloading effects during etching, the areas of the electrodes of the capacitors located along the edges of the array have tended to be slightly less than the areas of electrodes located completely inside the array. The present invention solves this problem by providing additional electrodes located along the periphery of the array, spaced the same distance away from the array edge as the spacing between electrodes inside the array.

9 Claims, 2 Drawing Sheets

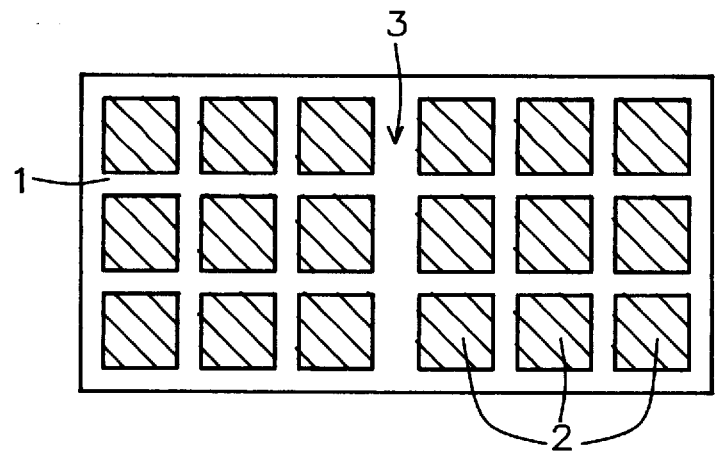
FIG. 1 – Prior Art
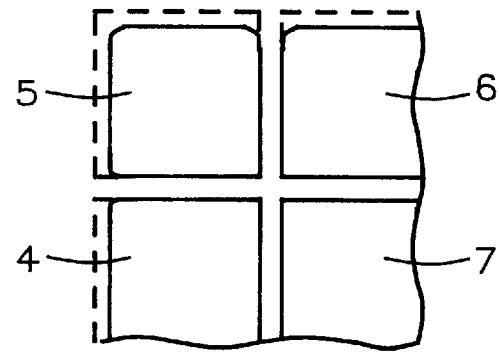
FIG. 2 – Prior Art
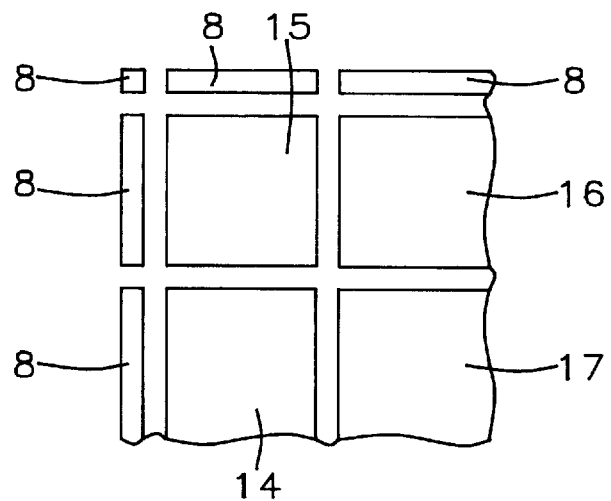
FIG. 3

5,838,032

PRECISION CAPACITOR ARRAY

This is a division of application Ser. No. 08/490,856, filed Jun. 15, 1995, which issued on Jun. 3, 1997 as U.S. Pat. No. 5,635,421.

BACKGROUND OF THE INVENTION (1) Field of the Invention

The invention relates to the field of silicon integrated circuits that include capacitor arrays, particularly for use in analog-to-digital and digital-to-analog converter circuits.

(2) Description of the Prior Art

Analog-to-digital converters operate on the general principle of successively dividing an analog voltage by 2 and then determining whether or not there is a remainder (by comparing the quotient with a preset standard value). In conventional (macro) circuitry, the voltage division is accomplished by applying the full voltage across two resistors of identical value that have been connected in series and then reading the value across one of them. While voltage dividers of this sort are conceptually quite straightforward, they require resistors of great precision (generally better than 1%). This is not difficult to achieve in macrocircuits since the resistors can be individually trimmed to very close tolerances.

It turns out that in microcircuits based on Field Effect Transistor (FET) technology, it is easier to manufacture matching capacitors as opposed to matching resistors in the right resistance range. When voltage is applied across two capacitors in series, charge, rather than voltage, is shared between them, but the net effect is the same in terms of application to analog-to-digital converters. Similar considerations also point to the usefulness of precision capacitor arrays in digital-to-analog converters.

Capacitor arrays for the applications being discussed herein often share a common, grounded, base electrode and a common layer of capacitor dielectric material. Differentiation into the individual capacitors that comprise the array is then achieved by etching the second (upper) conducting layer into individual, electrically separate, upper electrodes.

The formation of these individual electrodes is achieved through standard photolithographic processes—photoresist masking followed by etching. While the state of the art permits very precise control of the dimensions of the photoresist mask, subsequent etching of the upper conducting layer does not always proceed uniformly over the entire surface. In particular, we have observed that the upper electrodes that lie on the periphery of the array tend to end up slightly smaller than the electrodes in the body of the array.

McNutt et al. (U.S. Pat. No. 5,322,438 June 1994) discuss a variety of layout criteria that pertain to capacitor arrays and their optimization within silicon integrated circuits. One of their criteria involves the placement of grounded dummy unit capacitors around the periphery of each capacitor array. These units are identical in size and shape to the capacitors in the array but do not share either the lower conductive layer or the dielectric layer with the array. The dummy units, in addition to being grounded, are electrically connected to the array capacitors.

SUMMARY OF THE INVENTION

It is an object of the present invention to provide an array of capacitors within a silicon integrated circuit such that the capacitors that are located on the periphery of the array do not differ in value from the capacitors that are located within the body of the array.

It is a further object of the invention to neutralize any microloading effects that might occur when said capacitor array is being formed through a combination of photolithography and etching.

This has been achieved through the provision of a plurality of microload relief electrodes positioned around the periphery of the capacitor array and spaced the same distance from the array capacitors as the spacing between capacitors within the array.

BRIEF DESCRIPTION OF THE DRAWINGS

FIG. 1 is a plan view of a typical capacitor array.

FIG. 2 is an enlarged view of a corner of a capacitor array illustrating the effects of microloading during etching.

FIG. 3 shows how microload relief electrodes may be used in a capacitor array.

DESCRIPTION OF THE PREFERRED EMBODIMENTS

Figure 4:
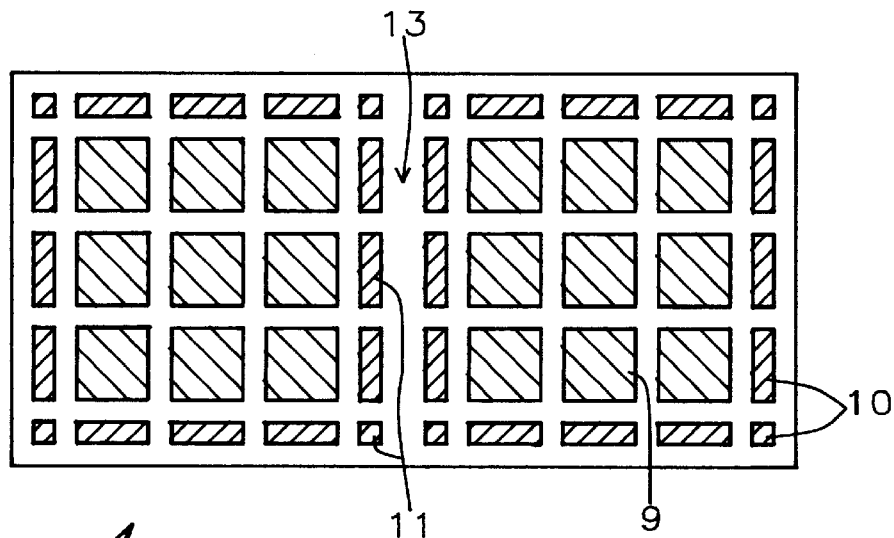
FIG. 4 shows the array of FIG. 1 after incorporation of the present invention.

Referring now to FIG. 1 we show a plan view of a typical capacitor array. Dielectric layer 1 was deposited over a common lower electrode (not shown here). This was followed by the deposition of an upper conductive layer which was subsequently etched into individual and separate upper electrodes, such as 2, as illustrated. Note that FIG. 1 actually depicts two arrays, separated one from another by channel 3 whose width is greater than the spacing between upper electrodes such as 2.

FIG. 2 shows, schematically, a close up view of the top left hand corner of one of the two arrays seen in FIG. 1. The actual boundaries of the upper electrodes, after etching, are shown as solid lines while the broken lines depict the original photoresist mask prior to etching. As can be seen, upper electrodes 4, 5, and 6 have been undercut relative to the original photoresist mask along those edges that face the periphery of the array. In contrast, upper electrode 7 which is surrounded on all sides by other electrodes has not been undercut. Note that the electrodes located to the right and below 7 are not actually shown in FIG. 2. While this selective undercutting along the edge of the array is not a large effect it is sufficient to reduce the capacitance associated with electrode 5, relative to electrode 7, by about 2%. Because of the high level of precision required for the successful operation of the analog-to-digital and digital-to-analog circuits, this figure cannot be tolerated.

Analysis of this problem of overetching at the edges revealed that it was a result of microloading during etching. In any etching situation the local reaction slows down as etchant is consumed and replaced by the etch reaction products. The latter will be removed at a rate depending on the degree of agitation, convection, diffusion, etc. that is occurring at the reaction site and an equilibrium rate of etching is soon established. When two etching sites are close together etchant is consumed at a faster rate than if the sites were isolated from one another. Removal of reaction products and replacement with fresh etchant proceeds more slowly in this situation and the reaction rate at both sites is slowed down. This effect is referred to as microloading.

In the case of an array of electrodes, etching in the space between electrodes is subject to microloading effects whereas etching along the outer edges is not. To deal with this, the solution schematically illustrated in FIG. 3 was developed. Upper electrodes 14, 15, 16, and 17 correspond to electrodes 4, 5, 6, and 7 in FIG. 2. Additionally, microload relief electrodes 8 have been added to the structure. During etching they serve to provide an environment wherein the etchant undergoes the same amount of microloading along the edges of the array as inside it. Thus, electrodes 14, 15, and 16 are no longer subject to undercutting relative to electrode 17.

It is important to note that the distance between microload relief electrodes 8 and capacitor electrodes 14, 15, and 16 is the same as the spacing of these electrodes relative to one another. It should also be noted that, while the length of a microload relief electrode is required to match that of the capacitor electrode that is opposite to it, the width of the microload relief electrodes may be substantially less than that of the capacitor electrodes. We have found that a width between 2 and 5 microns for the microload relief electrodes works well. The fact that the microload relief electrodes may be much narrower than the capacitor electrodes is an important advantage associated with the present invention, particularly when space is at a premium.

Figure 5:
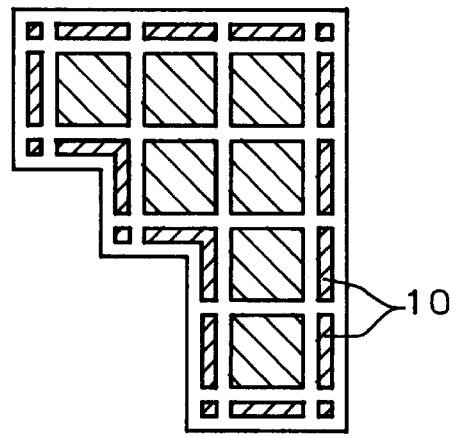
FIG. 5 is a capacitor array of irregular shape.

FIG. 4 shows the capacitor array of FIG. 1 after incorporation of the features of the present invention. Capacitor electrodes located along the edge of the array (such as 9, for example) are seen to be associated with microload relief electrodes such as 10. Note that open channel 3 in FIG. 1 has been widened in FIG. 4 (where it is now referenced as 13) to make room for microload relief electrodes such as 11. Even though channel 3 in FIG. 1 has upper electrodes on both sides of it, the width of channel 3 is greater than the distance between the upper electrodes relative to one another, so microload relief electrodes were needed to guarantee that no capacitor electrode was undercut during etching, relative to any other capacitor electrode. Thus, microload relief electrodes are always required along the periphery no matter what the shape of the capacitor array. For example, in FIG. 5 we show a capacitor array, intended to provide capacitance ratios of 1:2:4, together with its associated microload relief electrodes.

Although the invention, as described thus far, is applicable to any capacitor array of the thin film type, our purpose in developing this technology has been so that the arrays could be incorporated within silicon integrated circuits. Therefore, although the capacitors and microload relief electrodes could, in principle, be constructed from any conducting and dielectric materials, our preferred embodiment of the invention has utilized materials that were already being used for the construction of the integrated circuits themselves.

Figure 6:
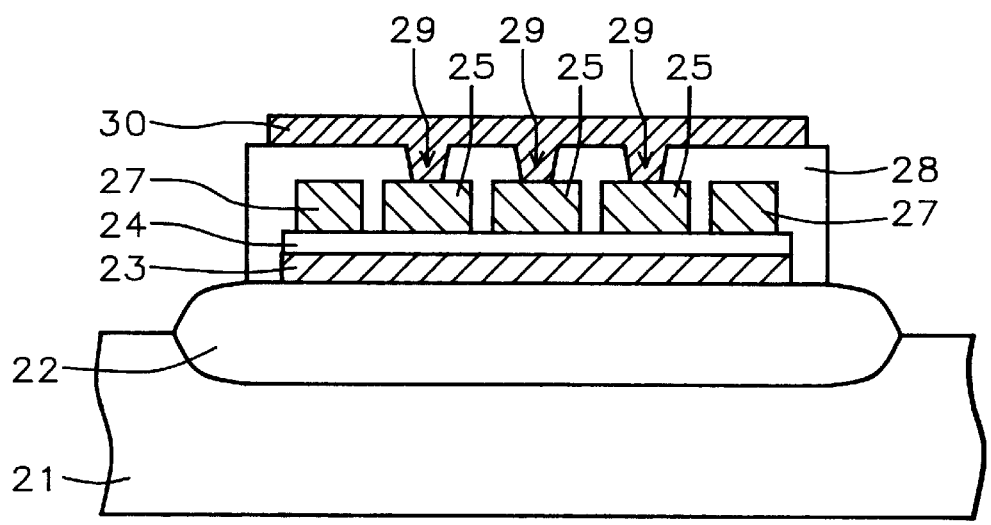
FIG. 6 is a schematic cross-section of part of an integrated circuit wherein a capacitor array, including the present invention, has been incorporated.

Different regions within an integrated circuit are electrically and physically isolated from one another by regions of thick silicon oxide known as field oxide. This is illustrated in FIG. 6 which is a schematic cross-section of a portion of a silicon integrated circuit wherein the present invention has been applied. Field oxide region 22 has been formed above silicon substrate 21. Common lower electrode 23 has been deposited on the surface of 22. Said common electrode comprises a layer of polycrystalline tungsten silicide deposited to a thickness of between about 2700 and 3300 Angstrom units by means of Chemical Vapor Deposition (CVD). Dielectric layer 24 comprises a layer of oxide deposited to a thickness of between about 400 and 700 Angstrom units by means of CVD.

Continuing reference to FIG. 6, upper electrodes 25 for the capacitor array and microload relief electrodes 27 have been formed by etching a second layer of polycrystalline silicon (thickness between about 2400 and 3000 Angstrom units) that was deposited onto the upper surface of 24. The etching technique for forming said upper and microload relief electrodes comprised dry etching and immersion in hydrofluoric acid for from about 3 to 5 minutes at a temperature between about 20° and 30° C.

The structure was completed by depositing passivation layer 28 comprising oxide over the upper and microload relief electrodes followed by the etching of via holes 29. A layer of aluminum 30 was then deposited over passivation layer 28, making electrical contact with the upper surfaces of the capacitor (upper) electrodes 26. In an additional step (not illustrated here) aluminum layer 30 was etched into individual conductors that connected the individual capacitors to one another as well as to other parts of the integrated circuit. Thus the capacitor array could be incorporated as part of analog-to-digital or digital-to-analog converter circuits. Note that microload relief electrodes 27 have not been contacted by aluminum layer 30 but have been left electrically floating.

In order to illustrate the effectiveness of the present invention the following example is provided. Example I shows the ratio of the measured capacitance on the inside of the array vs. on the edge of the array, with and without the present invention:

Example I

| capacitance ratio | |
| --- | --- |
| without microload relief | with microload relief |
| 1.098 | 1.00035 |

Example I

In another embodiment of the present invention, electrical isolation of the capacitor array is achieved through use of PN junctions rather than field oxide. In such a case the common lower electrode comprises single crystalline silicon rather than polycrystalline silicon. Similarly, the upper electrodes could be formed from a different conductor such as aluminum and the dielectric layer could be formed from insulators such as aluminum oxide or barium titanate.

While the invention has been particularly shown and described with reference to these preferred embodiments, it will be understood by those skilled in the art that various changes in form and details may be made without departing from the spirit and scope of the invention.

What is claimed is:

1. A precision capacitor array comprising:

a lower electrode having a first thickness;

a dielectric layer, having a second thickness, covering said lower electrode;

an array of upper electrodes, having a third thickness and a separation, on said dielectric layer;

microload relief electrodes, having a width between about 2 and 5 microns, surrounding said array and positioned such that separation between the upper electrodes and the microload relief electrodes is the same as the separation between upper electrodes;

a passivation layer covering a surface of said upper electrodes and said microload relief electrodes;

via holes, having a bottom, etched through said passivation layer so as to expose the surface of said upper electrodes; and a conductive layer covering said passivation layer, electrically contacting said upper electrodes at the bottom of said via holes, and patterned to form individual conductors connecting said upper electrodes.

2. The precision capacitor array described in claim 1 wherein said lower electrode comprises a conductor selected from the group consisting of single crystal silicon, polycrystalline silicon, and aluminum.

3. The precision capacitor array described in claim 1 wherein said dielectric layer comprises a material selected from the group consisting of silicon oxide, aluminum oxide, and barium titanate.

4. The precision capacitor array described in claim 1 wherein said upper electrodes and said microload relief electrodes comprise a conductor selected from the group consisting of polycrystalline silicon, and aluminum.

5. The precision capacitor array described in claim 1 wherein said first thickness of said lower electrode is between about 2700 and about 3300 Angstrom units.

6. The precision capacitor array described in claim 1 wherein said second thickness of said dielectric layer is between about 400 and about 700 Angstrom units.

7. The precision capacitor array described in claim 1 wherein said third thickness of said upper electrodes and said microload relief electrodes is between about 2400 and about 3000 Angstrom units.

8. The structure described in claim 1 wherein said structure is used as part of an analog-to-digital converter circuit.

9. The structure described in claim 1 wherein said structure is used as part of a digital-to-analog converter circuit.

* * * * *